US005368683A

United States Patent [19]

Altavela et al.

[11] Patent Number: 5,368,683

[45] Date of Patent: Nov. 29, 1994

[54] METHOD OF FABRICATING INK JET PRINTHEADS

[75] Inventors: Robert P. Altavela, Pittsford; Ram S. Narang; David J. Collins, both of Fairport; Julie A. Sims, Rochester, all of N.Y.

[73] Assignee: Xerox Corporation, Stamford, Conn.

[21] Appl. No.: 144,362

[22] Filed: Nov. 2, 1993

[51] Int. Cl.[5] ....................... H01L 21/306; B44C 1/22; B29C 37/00

[52] U.S. Cl. .................................... 156/633; 156/634; 156/644; 156/654; 156/662; 156/668

[58] Field of Search ............... 156/629, 633, 644, 645, 156/654, 656, 657, 659.1, 662, 634, 651, 653, 901, 668; 346/140 R, 1.1, 75

[56] References Cited

U.S. PATENT DOCUMENTS

| | | | |
|---|---|---|---|
| Re. 32,572 | 1/1988 | Hawkins et al. | 156/626 |
| 4,678,529 | 7/1987 | Drake et al. | 156/234 |
| 4,774,530 | 9/1988 | Hawkins | 346/140 |
| 5,068,006 | 11/1991 | Fisher | 156/633 |
| 5,160,403 | 11/1992 | Fisher et al. | 156/633 |

*Primary Examiner*—William Powell
*Attorney, Agent, or Firm*—Robert A. Chittum

[57] ABSTRACT

A plurality of ink jet printheads are produced from two aligned and bonded substrates by an improved fabrication method. The confronting surface of one of the substrates contains a plurality of linear arrays of heating elements and driver circuitry, and the confronting surface of the other substrate contains a plurality of sets of shallow channel recesses, reservoir recesses, and alignment openings. Prior to mating of the substrates, the substrate surface having the channel recesses is coated with a layer of thermosetting adhesive, and a thick film layer is deposited on the substrate surface having the heating elements and driver circuitry and patterned to provide a plurality of vias therein at predetermined locations. The vias expose the heating elements, provide ink bypass trenches, and provide a number of groupings of small pits. In one embodiment, the alignment openings are used to visually align and mate the substrates, so that each alignment opening is aligned with a respective one of the groups of small pits in the thick film layer. To prevent misalignment between the substrates before the adhesive layer is cured, a UV curable adhesive is inserted into the alignment openings and into each group of small pits in the thick film layer aligned therewith and cured, thus fastening the substrates together. The fastened substrates are placed in a curing oven without lost of alignment therebetween and the thermosetting adhesive is cured. The bonded substrates are then diced into a plurality of individual printheads.

9 Claims, 4 Drawing Sheets

METHOD OF FABRICATING INK JET PRINTHEADS

BACKGROUND OF THE INVENTION

This invention relates to the ink jet printing technology, and more particularly to an improved method of fabricating a plurality of printheads from two aligned and bonded substrates which are fastened together by a thermosetting adhesive and a UV curable adhesive inserted into alignment openings formed in portions of the substrates to hold the substrates together until the thermosetting adhesive is cured. The portions of the mated substrates having the alignment openings with the UV curable adhesive are discarded when the substrates are diced into a plurality of separate printheads.

Drop on demand jet printing systems can be divided into two basic types. One type uses a piezoelectric transducer to produce a pressure pulse that expels a droplet from a nozzle and, the other type uses thermal energy to produce a vapor bubble in an ink filled channel that expels a droplet. This latter type is referred to as thermal ink jet printing or bubble jet printing. Generally, thermal ink jet printing systems have a printhead comprising one or more ink filled channels that communicate with a relatively small ink supply chamber at one end, and have an opening at the opposite end, referred to as a nozzle. A thermal energy generator, usually a resistor, is located in the channels near the nozzle a predetermined distance upstream therefrom. The resistors are individually addressed with a current pulse representative of data signals, to momentarily vaporize the ink and form a bubble which expels an ink droplet.

One preferred method of fabricating thermal ink jet printheads is to form the heating elements on the surfaces of one silicon wafer and the channels and small ink supply chamber of reservoir in the surface of another silicon wafer. The two wafers are precisely aligned to insure that the heating elements are aligned to their corresponding channels, and then the two wafers are bonded together. The individual printheads are obtained by dicing the two bonded wafers. This general process has been described in Re. U.S. Pat. No. 32,572 to Hawkins et al. A critical part of this assembly process is the bonding adhesive and its application. Since two silicon wafers are mated that are extremely flat, a thin adhesive coating is sufficient to bond the two together, and a much thicker coat will clog the channels. U.S. Pat. No. 4,678,529 to Drake et al., describes a method of bonding the ink jet printhead components together by coating a flexible substrate with a relatively thin uniform layer of an adhesive having an intermediate non-tacky curing stage. About half of the adhesive layer is transferred from the flexible substrate to the high points or lands of one of the printhead components by placing it in contact therewith, and applying a predetermined temperature and pressure to the flexible substrate prior to peeling it from the printhead component. This causes the adhesive to fail cohesively in the liquid state, assuring that about half of the thickness of the adhesive layer stays with the flexible substrate and is discarded therewith, leaving a very thin uniform layer of adhesive on the printhead component lands. The transferred adhesive layer remaining on the printhead component enters an intermediate non-tacky curing stage to assist in subsequent alignment of the printhead components. The printhead components are aligned and the adhesive layer cured to complete the fabrication of the printhead.

U.S. Pat. No. 4,774,530 to Hawkins discloses an improved ink jet printhead which comprises an upper and lower substrate that are mated and bonded together with a thick film insulative layer sandwiched therebetween. The thick film layer is deposited on the substrate containing the heating elements and addressing electrodes and recesses are patterned in the thick film layer to expose the heating elements to the ink, thus placing them in a pit and to provide a flow path for the ink from the reservoir to the channels by enabling the ink to flow around the closed ends of the channels, thereby eliminating the fabrication steps required to open the channel grooves to the reservoir recess.

It has been found that movement of the aligned and mated wafers from an assembly fixture to a curing oven to cure the adhesive and permanently bond the wafers together frequently causes the wafers to become misaligned, therefore reducing the yield of printheads. The present invention eliminates the misalignment problem that occurs prior to complete curing of the bonding adhesive between the wafers.

SUMMARY OF THE INVENTION

It is an object of the present invention to provide an improved ink jet printhead fabricating process to eliminate the misalignment occurring between the wafers prior to curing of the thermosetting adhesive therebetween.

In the present invention, a plurality of ink jet printheads are produced from two aligned and bonded substrates by an improved fabrication method that includes etching an additional set of alignment openings in the channel wafer and patterning a plurality of vias in the thick film layer at predetermined locations. The alignment openings may be used to visually align and mate the channel and heater wafers, so that each alignment opening is aligned with a respective one of the groups of small pattern pits in the thick film layer. To prevent misalignment between the wafers before the thermosetting adhesive layer is cured, a UV curable adhesive or other fast drying adhesive is inserted into the alignment openings and into each of the groups of small pits in the thick film layer aligned therewith and cured, thus fastening the wafers together. The fastened wafers are placed in a curing oven without loss of alignment therebetween, and the thermosetting adhesive is cured. The bonded substrates are then diced into a plurality of individual printheads.

A more complete understanding of the present invention can be obtained by considering the following detailed description in conjunction with the accompanying drawings wherein like index numerals indicate like parts.

DESCRIPTION OF THE PREFERRED EMBODIMENT

Figure 8:
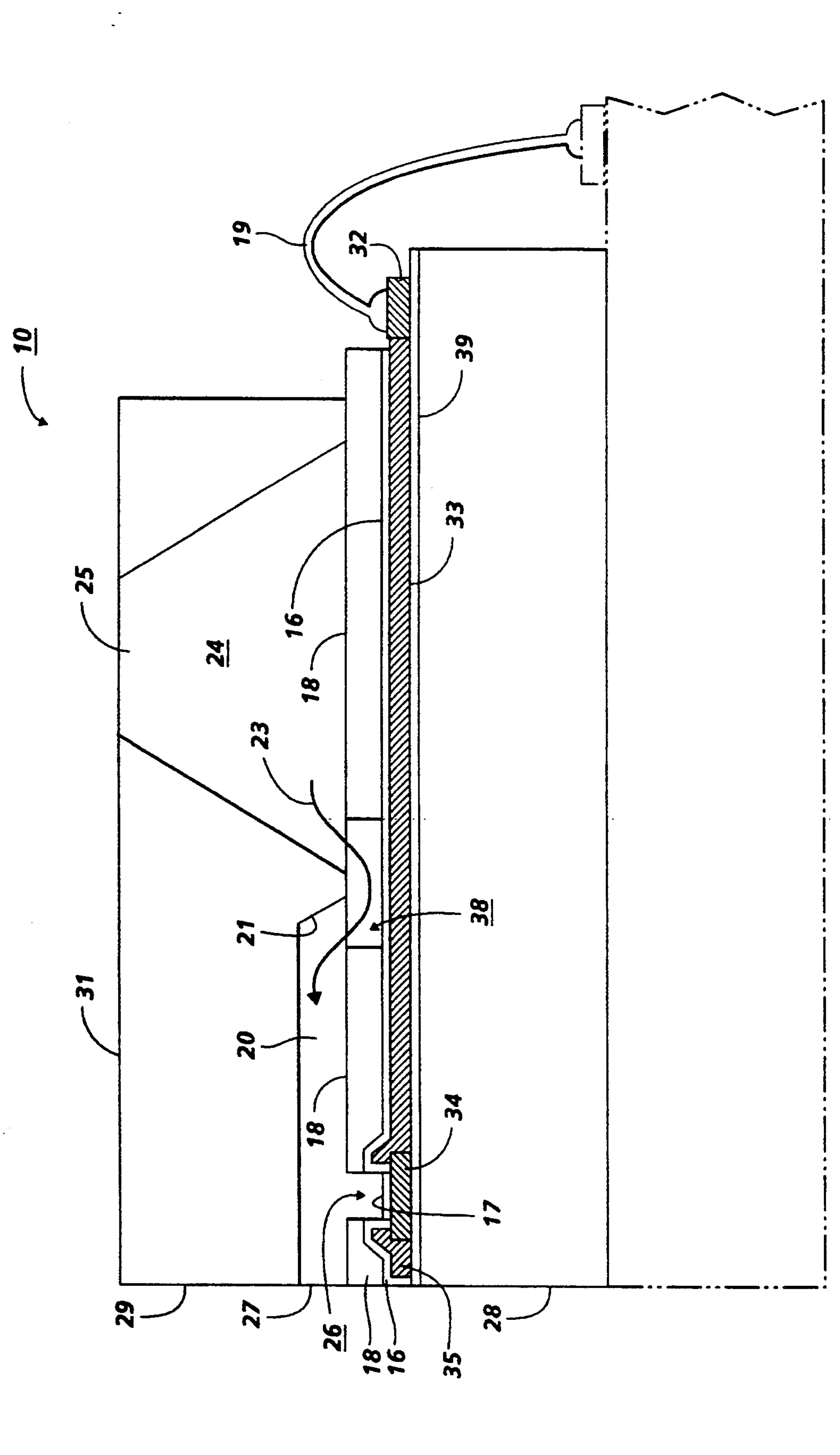
FIG. 8 PRIOR ART
FIG. 8 is an enlarged cross-sectional view of a typical thermal ink jet printhead showing electrode passivation and ink flow path between the reservoir and the ink channels.

As disclosed in Re. U.S. Pat. No. 32,572 to Hawkins, U.S. Pat. No. 4,678,529 to Drake et al., and U.S. Pat. No. 4,774,530 to Hawkins, all of which are incorporated herein by reference, a plurality of individual printheads 10, as shown in FIG. 8, are fabricated in accordance with the present invention by forming a plurality of arrays of heating elements 34 and a driver circuitry 33 for each array with addressing electrodes and common return 35 on a surface of a planar substrate, such as a silicon wafer. The portion of the substrate or wafer containing one array of heating elements and an associated driver circuitry with electrodes and common return is referred to as a heater plate 28. A thick-film, polymeric layer is deposited on the wafer surface with the heating elements and is patterned to remove the thick-film layer directly over the heating elements and electrode terminals 32 and to provide a bypass trench 38 (or individual bypass pits 38, one for each channel recess). The exposed heating elements are thus recessed in pits 26 and the terminals are exposed for subsequent wire bonding to a source of electrical signals from the printer controller (not shown) by a printed circuit board 15, shown in dashed line. A second, similar substrate or silicon wafer having on one surface thereof a plurality of sets of etched channel recesses or grooves 20 with an etched reservoir recess 24 for each set of channel recesses is provided, and the wafer surface with the recesses is coated with a thermosetting adhesive. The portion of the substrate or wafer containing one set of channel recesses and associated reservoir recess is referred to as channel plate 31. The two wafers are aligned and mated, so that the wafer surface with the recesses and adhesive coating is in contact with the patterned thick-film layer on the wafer surface containing the heating elements and associated circuitry. Each channel recess has a heating element in a pit and a bypass recess in the thick-film layer to permit the flow of ink from the reservoir to the channels. The adhesive coating is cured and the bonded wafers are diced into a plurality of individual printheads. As indicated above, the slightest misalignment between the wafers prior to curing of the adhesive may reduce the number of acceptable printheads or totally ruin the entire batch of printheads.

Figure 1:
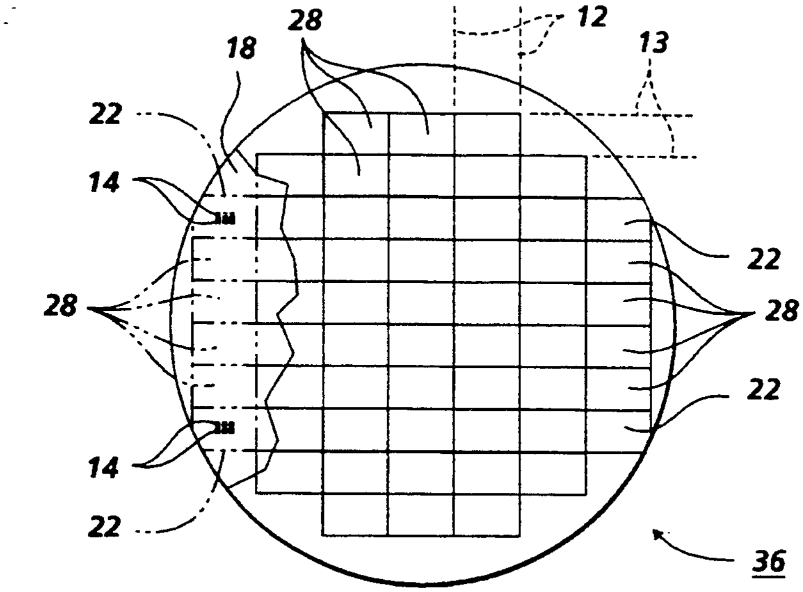
FIG. 1 is a schematic plan view of a wafer having a plurality of heating element arrays and addressing electrodes.
Figure 2:
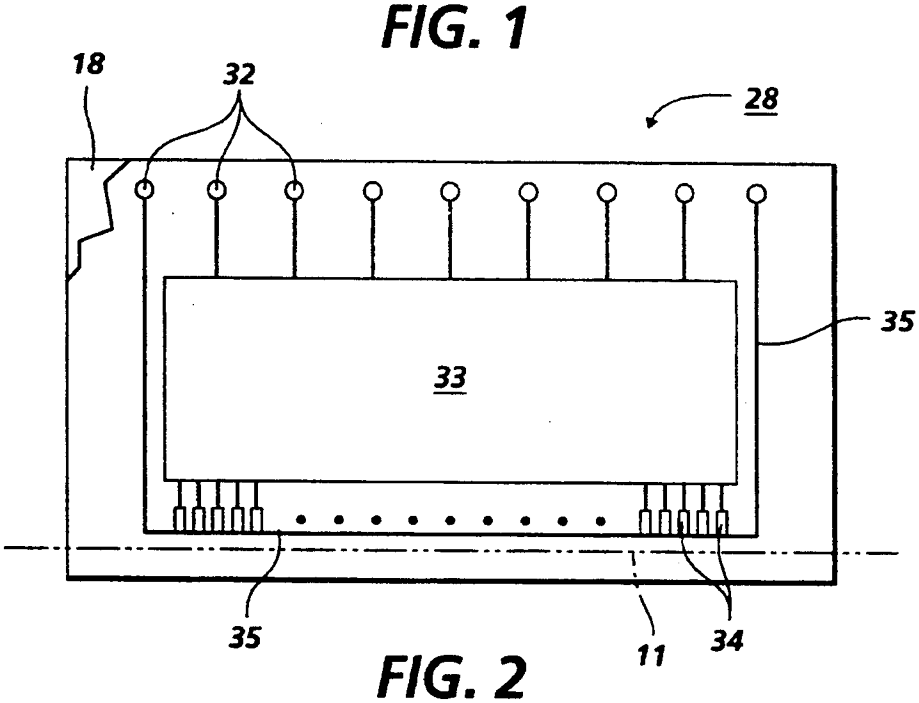
FIG. 2 is a schematic plan view of one heating element array on a portion of the wafer with the thick film layer removed from all but a corner of the surface of the wafer portion containing the heating element array.
Figure 3:
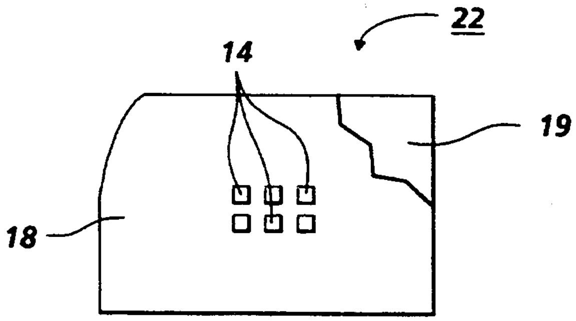
FIG. 3 is a plan view of a discardable wafer portion having a group of small pits formed in the thick film layer.

This potential for misalignment of wafers is eliminated by the following fabricating process. Referring to FIGS. 1–3, a plurality of arrays of heating elements 34, driver circuitry and addressing electrodes 33, and common return 35 for each array of heating elements are fabricated on the surface 19 of silicon wafer 36, as disclosed in the above-referenced patents incorporated herein by reference. The portion of the wafer containing an array of heating elements and associated circuitry and electrodes is identified in FIG. 1 by rectangles 28, referred to as heater plates, one of which is enlarged and shown in FIG. 2. The heater plate 28 schematically shows the array of heating elements 34, driver circuitry and addressing electrodes 33, and common return 35 with electrode terminals 32 along one edge thereof. The thick-film layer 18 has been removed from all but one corner of the heater plate to better show the heating element array and circuitry. Dicing lines 12, 13 are shown in FIG. 1 to indicate that it is along these lines that the subsequent dicing process will separate the bonded wafers into separate printheads. After fabrication of the plurality of arrays of heating elements and circuitry on wafer surface 19, a thick-film, polymeric film 18 (partially removed), such as, for example, polyimide, is deposited thereover and patterned to form vias therein to expose the heating elements 34 and electrode terminals 32 and to provide the bypass trenches 38 (or individual bypass pits 38), as more fully described in U.S. Pat. No. 4,774,530 and shown in FIG. 8. In addition, the thick-film layer is patterned at predetermined locations around the periphery of the wafer to produce a plurality of groups of small vias or pits 14. The location of the groups of pits is generally selected so as to not interfere with the maximum use of the wafer for the heater plates. In the preferred embodiment, the portions of the wafer on which the groups of pits are patterned are those portions 22 which are discarded after the dicing operation which separates the printheads. Portion 22 of the wafer 36 containing the patterned group of pits 14 in the thick-film layer 18 is shown in FIG. 3, with a portion of the thick-film layer removed to show the wafer surface 19.

Figure 4:
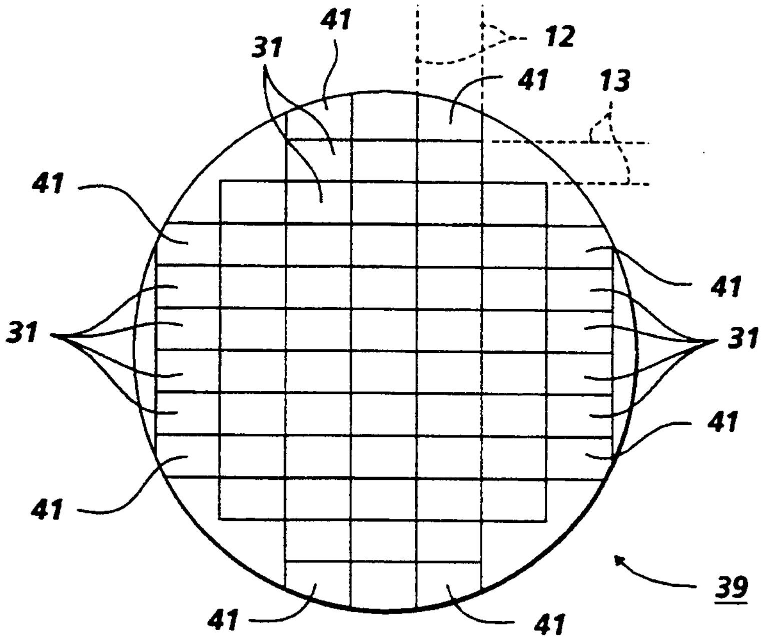
FIG. 4 is a schematic plan view of a wafer having a plurality of ink reservoir recesses and sets of ink channel recesses concurrently etched in one surface thereof.
Figure 5:
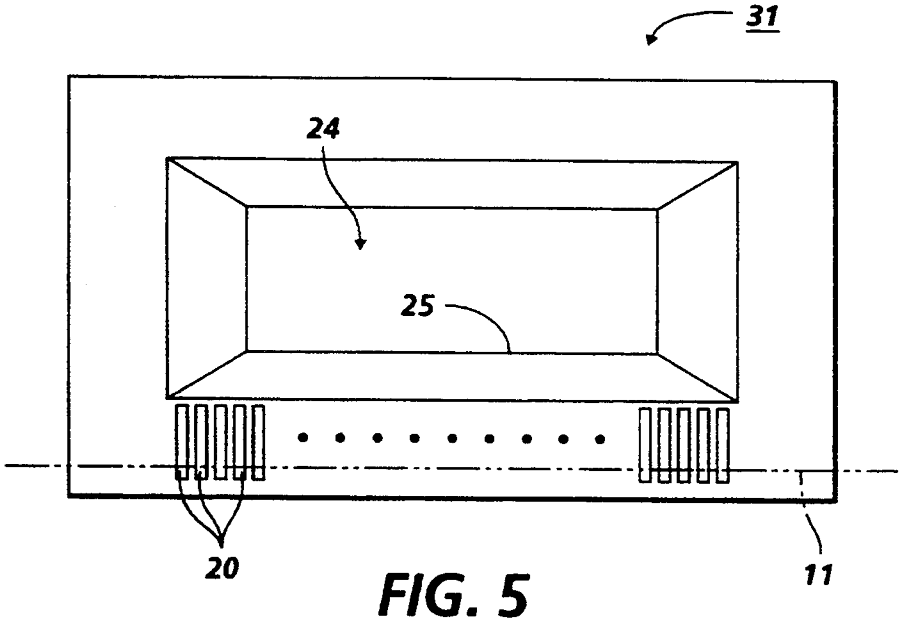
FIG. 5 is an enlarged view of one set of the channel recesses and one reservoir recess on a portion of the wafer.
Figure 6:
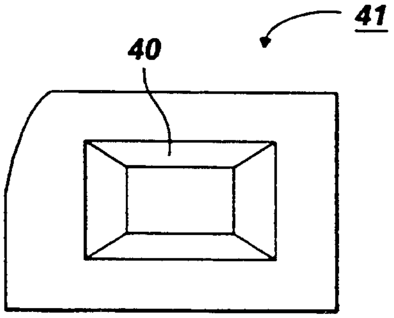
FIG. 6 is a schematic plan view of a portion of the wafer having one alignment opening therein.

A second silicon wafer 39 is photolithographically patterned and anisotropically etched to provide a plurality of sets of etched channel recesses 20 and reservoir recesses 24 as more described in U.S. Pat. No. 4,774,530 and the other above-mentioned patents all of which are incorporated herein by reference. The portion of the wafer containing one set of channel recesses and an associated reservoir recess is identified in FIG. 4 by rectangles 31, referred to as channel plates, one of which is enlarged and shown in FIG. 5. The channel plate 31 schematically shows the set of channel recesses 20 and reservoir recess 24. The reservoir recess is etched through the wafer so that the open bottom 25 may subsequently serve as an ink inlet or fill hole. Dashed line 11 shows the dicing line which will open the channel recesses to form the nozzles 27 and form nozzle face 29 (FIG. 8). Dicing lines 12, 13 in FIG. 4 for wafer 39 will be respectively registered with the dicing lines in FIG. 1 for wafer 36, when the wafers are mated, as explained later. Also, concurrently patterned and etched with the sets of channel recesses and reservoir recesses are alignment openings 40 located in predetermined locations. As in the location of the group of pits 14, the alignment openings are generally located so as not to interfere with the maximum utilization of wafer for the channel plates. The portions of the channel wafer 39 in which the alignment openings are etched through the wafer are those portions 41 which will be discarded after the dicing operation to separate the bonded wafers into separate printheads. Portion 41 of the wafer 39 is shown in FIG. 6.

Figure 7:
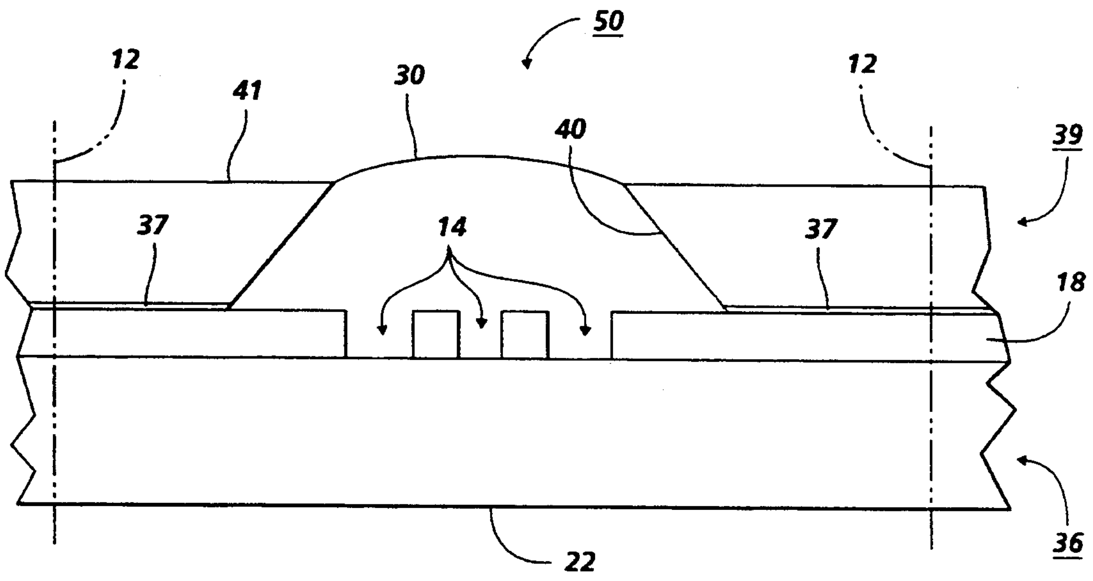
FIG. 7 is a partially shown cross-sectional view of the mated channel wafer and heater wafer showing one alignment hole with one group of small pits in the thick film layer therebelow, the alignment hole and group of small pits being filled with a UV curable adhesive.

The surface of wafer 39 containing the etched recesses is coated with a thin layer of thermosetting adhesive 37 (FIG. 7), by, for example, a technique disclosed in U.S. Pat. No. 4,678,529 incorporated herein by reference. Next, the wafers are aligned and mated using either an IR aligner (not shown) or visually by registering the alignment openings 40 with the group of pits 14. This alignment and mating of wafers places a heating element 34 in each ink channel 20 at the desired location therein, so that the dicing step (along dicing line 11) to open one end of the channels and form the nozzles 27 also places the heating element at the desired distance upstream from the nozzles. Concurrently, each of the bypass trenches 38 are located between a set of channel recesses and a reservoir 24. Referring to FIG. 7, the two mated wafers 36, 39 are held in alignment by an alignment fixture or IR aligner (not shown), and an ultra violet light (UV) curable adhesive 30, such as, for example, Loctite 375® by the Loctite Corporation, is inserted into the alignment openings 40 and into the groups of small pits 14 in the thick-film layer 18 aligned therewith by, for example, a syringe (not shown). The UV curable adhesive is exposed to ultra violet light (not shown) and cured. Alternatively, a fast curing adhesive or super glue, such as, for example, cyanoacylate may be substituted for the UV curable adhesive. The cyanoacylate cures in air very fast at room temperature. The thick-film layer is about 35 micrometers thick and each pit 14 in each group of pits extends through the thick-film layer. When the UV curable or other fast drying adhesive is cured, the pits act as anchor sights and improve the shear strength of the fastened points of the mated wafers. With the cured UV curable adhesive (or cured cyanoacylate) preventing slippage or misalignment between the mated wafers, the wafers are removed from the alignment fixture or IR aligner and moved to a curing oven or vacuum laminator (not shown) and the thermosetting adhesive 37 cured at elevated temperatures. After the thermosetting adhesive is cured, the wafers are bonded and diced along the dicing lines 11, 12, 13 to produce a plurality of individual printheads 10 and discardable or scrap portions 50, which comprise the wafer portions 22, 41 and the UV curable or other fast drying adhesive 30.

Many modifications and variations are apparent from the foregoing description of the invention and all such modifications and variations are intended to be within the scope of the present invention.

We claim:

1. A method of fabricating a plurality of ink jet printheads, comprising the steps of:

patterning a plurality of linear arrays of heating elements and a driver circuitry with associated addressing electrodes for each array of heating elements on a surface of a planar substrate, the addressing electrodes having terminals for electrical connection with a source of electrical signals;

depositing a photopatternable, thick-film, polymeric layer on the substrate surface and over the heating elements, driver circuitry, and associated addressing electrodes;

patterning a plurality of vias in the thick-film, polymeric layer at predetermined locations, the pattern of vias exposing each heating element and the electrode terminals and producing bypass recesses and a predetermined number of groups of relatively small recesses which will subsequently serve as bonding anchor points;

anisotropically etching a plurality of sets of elongated channel recesses having opposing ends, at least one ink reservoir recess for each set of channels, and a predetermined number of alignment recesses in a surface of a first silicon wafer, each of said reservoir recesses being located adjacent one end of each set of channel recesses, the reservoir recesses and alignment recesses being etched through the wafer;

coating the wafer surface having the etched channel, reservoir, and alignment recesses with a thermosetting adhesive layer without coating the recesses;

aligning and mating the substrate surface having the patterned thick-film, polymeric layer with the adhesive coated wafer surface having the etched recesses, so that each etched channel recess has a heating element therein, the bypass recesses provide ink flow communication between the channels and reservoirs, and each of the etched alignment recesses in the wafer are each aligned and in register with a respective one of the groups of relatively small recesses in the thick-film, polymeric layer;

filling each alignment recess and group of thick-film recesses therebelow with a quick curing adhesive;

curing the quick curing adhesive to fasten the substrate and wafer together prior to curing the thermosetting adhesive, the cured quick curing adhesive in each group of thick-film recesses providing anchor points to improve shear strength between the substrate and the wafer, thereby also preventing relative slippage between the substrate and wafer before the thermosetting adhesive layer is cured;

placing the mated substrate and wafer in an oven to cure the thermosetting adhesive and permanently bond the substrate and wafer together; and dicing the bonded substrate and wafer into a plurality of individual printheads and scrap portions.

2. The method of claim 1, wherein the planar substrate is a second silicon wafer and the thick-film polymeric layer is polyimide; and wherein the first and second silicon wafers have a circular periphery defined by a predetermined diameter.

3. The method of claim 2, wherein the alignment recesses and groups of thick-film recesses are located adjacent the periphery of the bonded first and second silicon wafers and in locations on the bonded first and second silicon wafers which will be scrap portions after dicing.

4. The method of claim 3, wherein the quick curing adhesive is a UV curable adhesive; and, wherein said curing of the UV curable adhesive is thereby exposed to UV light.

5. The method of claim 3, wherein the quick curing adhesive is cyanoacylate, and wherein said curing of the cyanoacylate is by exposure to air at room temperature.

6. A method of fabricating a plurality of ink jet printheads, comprising the steps of:

anisotropically etching a channel wafer to provide a plurality of sets of channel recesses and reservoir recesses in one surface thereof, at least one reservoir recess for each set of channel recesses, and to provide a predetermined number of relatively small etched-through alignment recesses at predetermined locations;

providing a heater wafer with a plurality of arrays of heating elements with driver circuitry and addressing electrodes on one surface thereof, the driver circuitry and electrodes having terminals for application of electrical signals;

depositing a thick film polymeric layer over the heater wafer surface with the heating elements, driver circuitry, and electrodes;

patterning the thick film layer to expose the heating elements and the terminals of the circuitry and electrodes and to provide ink flow bypass recesses and a predetermined number of groups of relatively small recesses at predetermined locations, the groups of recesses subsequently serving as bonding anchor points;

coating the surface of the channel wafer having the channel and reservoir recesses with a thermosetting adhesive;

aligning and mating the channel wafer surface with the adhesive coating and the heater wafer surface having the patterned thick film layer, so that each channel recess has a heating element and each small etched through alignment recess is aligned with a one of the groups of relatively small recesses in the thick film layer;

inserting and curing a quick curing adhesive into the alignment recesses and group of relatively small recesses to fasten the channel wafer and heater wafer together prior to curing of the thermosetting adhesive;

heating the fastened wafers to cure the thermosetting adhesive, thereby bonding the wafer surfaces together; and dicing the bonded wafers into a plurality of printheads.

7. The method of claim 6, wherein the wafers are circular (100) silicon wafers having a predetermined diameter; wherein the thick film polymeric layer is polyimide; and wherein alignment recesses and groups of thick film recesses are located adjacent outer edges of the bonded wafers and in locations which will be scrapped after dicing to maximize the number of printheads per pair of bonded wafers.

8. The method of claim 7, wherein the quick curing adhesive is a UV curable adhesive and the curing thereof is by exposure to UV light.

9. The method of claim 7, wherein the quick curing adhesive is cyanoacylate which is curable by exposure to air at room temperature.

* * * * *